(12) United States Patent
Wang et al.

(10) Patent No.: US 9,850,569 B2
(45) Date of Patent: Dec. 26, 2017

(54) ION IMPLANTATION FOR SUPERCONDUCTOR TAPE FABRICATION

(71) Applicant: Varian Semiconductor Equipment Associates, Inc., Gloucester, MA (US)

(72) Inventors: Connie P. Wang, Mountain View, CA (US); Paul Murphy, Reading, MA (US); Paul Sullivan, Wenham, MA (US); Ludovic Godet, Boston, MA (US); Frank Sinclair, Boston, MA (US); Morgan Evans, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 704 days.

(21) Appl. No.: 14/091,510

(22) Filed: Nov. 27, 2013

(65) Prior Publication Data
US 2016/0160344 A1    Jun. 9, 2016

(51) Int. Cl.
| | |
|---|---|
| *C23C 8/36* | (2006.01) |
| *C23C 14/48* | (2006.01) |
| *H01L 39/14* | (2006.01) |
| *H01L 39/24* | (2006.01) |
| *C23C 14/02* | (2006.01) |
| *C23C 14/58* | (2006.01) |
| *H01B 12/02* | (2006.01) |
| *H01B 13/00* | (2006.01) |

(52) U.S. Cl.
CPC ............ *C23C 14/48* (2013.01); *C23C 14/025* (2013.01); *C23C 14/5806* (2013.01); *H01B 12/02* (2013.01); *H01B 13/0016* (2013.01); *H01B 13/0036* (2013.01); *H01L 39/143* (2013.01); *H01L 39/2464* (2013.01)

(58) Field of Classification Search
CPC ........................................................ C23C 14/48
See application file for complete search history.

(56) References Cited

U.S. PATENT DOCUMENTS

| | | | |
|---|---|---|---|
| 4,916,083 A * | 4/1990 | Monkowski | ...... H01L 21/76897 257/586 |
| 5,912,503 A * | 6/1999 | Chan | ................... H01L 39/2464 257/661 |
| 2004/0018394 A1 * | 1/2004 | Jia | .......................... C30B 23/02 428/701 |

(Continued)

FOREIGN PATENT DOCUMENTS

| | | |
|---|---|---|
| CN | 102598159 A | 7/2012 |
| JP | H06283775 A | 10/1994 |

(Continued)

OTHER PUBLICATIONS

International Search Report and Written Opinion dated May 7, 2015, in corresponding PCT/US2014/065600.

(Continued)

*Primary Examiner* — Paul Wartalowicz

(57) ABSTRACT

A method of forming a superconductor tape, includes depositing a superconductor layer on a substrate, forming a metal layer comprising a first metal on a surface of the superconductor layer, and implanting an alloy species into the metal layer where the first metal forms a metal alloy after the implanting the alloy species.

10 Claims, 9 Drawing Sheets

(56) References Cited

U.S. PATENT DOCUMENTS

| | | | | |
|---|---|---|---|---|
| 2005/0116204 A1* | 6/2005 | Moeckly | ............... | C23C 14/067 |
| | | | | 252/500 |
| 2010/0173784 A1* | 7/2010 | Lee | ....................... | H01L 39/143 |
| | | | | 505/237 |
| 2012/0238454 A1 | 9/2012 | Yoshizumi et al. | | |

FOREIGN PATENT DOCUMENTS

| | | | |
|---|---|---|---|
| JP | H07182937 | A | 7/1995 |
| JP | H07263767 | A | 10/1995 |
| KR | 20040074694 | A | 8/2004 |
| KR | 20060127859 | A | 12/2006 |
| WO | WO2005006350 | A2 | 1/2005 |
| WO | WO2015116289 | A2 | 8/2015 |

OTHER PUBLICATIONS

Supplemental European Search Report dated Jul. 12, 2017 for European Patent Application No. 14865550.9.

* cited by examiner

ION IMPLANTATION FOR SUPERCONDUCTOR TAPE FABRICATION

FIELD

The present embodiments relate to superconducting materials and, more particularly, to superconductor tape fabrication.

BACKGROUND

The synthesis of high temperature superconducting (HTS) devices such as HTS tapes involves many challenges including the need to form a complex stack of materials that constitute the HTS tape. In a conventional superconductor tape a superconductor layer is supported by a base layer that may be a steel material. A shunt metal layer or layers is formed on top of the superconductor layer on a side opposite the base layer to provide a current conduction path when a fault occurs. When a fault takes place in an SCFCL, due to the finite resistance acquired by the superconducting layer, current that is conducted almost exclusively through the superconductor layer under normal operation of the SCFCL is diverted into metallic layers that are in contact with the superconductor layer, which layers typically present lower resistance than the now-resistive superconductor layer. The current passing through the metallic layers during the fault condition may cause resistive heating that generates temperatures up to 200° C. or more in the HTS tape. As a result of high temperatures, roughening of metal surfaces as well as oxidation may take place in local spots or at a metal layer interface, leading to degradation of the metallic layers and reducing the lifetime of the HTS tape.

On the other hand, in order to affect a significant voltage drop along the length of the superconductor tape, it may be desirable to increase the sheet resistance of the metallic layers in the HTS tape. Although this could in principle be accomplished by decreasing the thickness of a metal layer such as silver, the reduced thickness may lead to increased susceptibility to agglomeration or other degradation that may shorten the HTS tape lifetime. Accordingly, tailoring of properties of shunt metal layers in superconductor tapes in order to increase robustness may be desirable. It is with respect to these and other considerations that the present improvements are needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a method of forming a superconductor tape includes depositing a superconductor layer on a substrate; forming a metal layer comprising a first metal on a surface of the superconductor layer; and implanting an alloy species into the metal layer, wherein the first metal forms a metal alloy after the implanting the alloy species.

In another embodiment, a method of processing a superconductor tape includes providing the superconductor tape as a free standing tape comprising a superconductor layer and a metal layer; directing ions into an implant zone along a first direction; and drawing the superconductor tape through the implant zone along a draw axis perpendicular to the first direction wherein the metal layer is exposed to the ions.

DETAILED DESCRIPTION

Figure 1A:
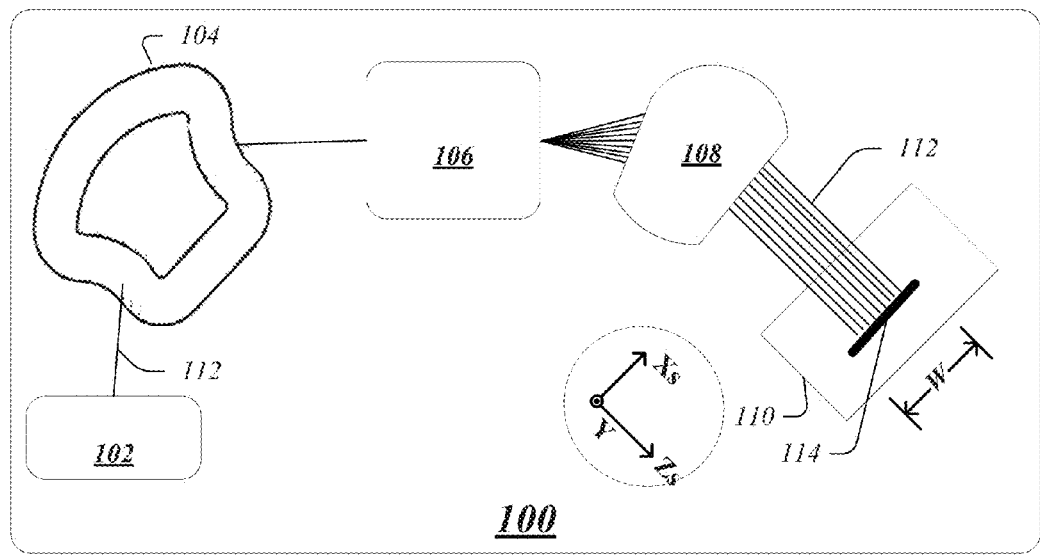
FIG. 1A and FIG. 1B depict a top view of alternative ion implanters consistent with the present embodiments.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

To address some of the deficiencies in the aforementioned superconductor tapes, embodiments are described herein that provide improved structure for superconductor tapes as well as improved techniques for forming superconductor tapes. These embodiments also provide improved devices that integrate a superconductor layer and metal layer in a stack of layers disposed on a substrate.

To address fabrication issues of conventional superconductor tapes, the present embodiments in particular provide improved metal layers and techniques for forming metal layers for use in devices such as multilayer superconductor tapes. In various embodiments, ion implantation is used to process a metal layer in a device such as a superconductor tape to adjust properties of the metal layer including mechanical and thermal stability, as well as desired resistivity. In particular, the ion implantation may be used to create a metal alloy material in the metal layer that imparts a combination of desired properties for the metal layer.

In the present embodiments ion implantation into superconductor tape structure may be performed in any apparatus suitable for implanting ions of a desired energy and species including a beam line ion implanter. As detailed below, the superconductor tape structure may be a free-standing superconductor tape, a tape wrapped on a barrel, or may be a tape-like structure that is integrated into a rigid planar substrate such as a silicon wafer or a glass plate. In various embodiments, and as detailed below, a novel ion implanter is configured to process a superconductor tape in a rapid manner that is compatible with high volume manufacturing.

FIG. 1A presents a top view that depicts features of a beamline ion implantation apparatus, ion implanter 100, which may be used to perform ion implantation into a superconductor tape structure. The various elements of the ion implanter 100 include an ion source 102, analyzing magnet 104, a scanner 106, collimator 108, and implantation chamber 110. The ion implanter 100 is configured to generate an ion beam 112 and deliver the ion beam 112 to a substrate 114. The particular configuration illustrated in FIG. 1A may be particularly suited for medium current ion implantation. However, the embodiments are not limited in this context. The operation of various components of the ion implanter 100, including ion source 102, analyzing magnet 104, mass analysis slit (not separately shown) are well known and further discussion of such components is omitted herein. However, as generally depicted in FIG. 1A, the ion beam 112 may be provided as a wide ion beam in the Xs direction of the Cartesian coordinate system shown. The ion beam 112 may be scanned spot beam, for example, that is scanned to provide the resulting ion beam 112 at the substrate 114 as shown. In another embodiment, the ion implanter may be high current ion implanter and the ion beam 112 may be a ribbon beam. In the present embodiment, the substrate 114 may be a superconductor. In some other embodiments, the substrate 114 may be a rigid planar substrate such as a silicon wafer, glass plate, sapphire wafer, and so forth. Implantation chamber 110 may include components (not shown) such as substrate stage, substrate handler, heater, sensors, and other components as known in the art.

As detailed below, the ion implanter 100 may be used to implant a substrate having a superconductor tape-like structure that includes an integrated superconductor tape including a superconductor layer and metal layer disposed on a surface of the superconductor. Implantation of the metal layer may be performed as part of a superconductor tape manufacturing process. In various embodiments the metal layer may act as a shunt metal layer that is designed to conduct current, for example, during a fault condition when the substrate is operated as a fault current limiter component. The implantation of the shunt layer may improve durability of the shunt metal layer, as well as tailoring the resistivity of the shunt metal layer to a desired range.

As detailed below, in particular embodiments, the ion implanter 100 may include additional apparatus disposed inside and adjacent to implantation chamber 110 for processing free-standing tapes, such as a superconductor tape. In these embodiments the superconductor tape may be fed into the implantation chamber 110 for exposure to the ion beam 112 in order to implant a shunt metal layer or other metal layer in the tape.

After ion implantation is performed in the ion implanter 100 various additional processes may be performed on the substrate 114 including the deposition of another metal layer on outer surface of the shunt metal layer, as well as annealing of the substrate 114. The deposition of a second metal layer may be used to protect the shunt metal layer as well as to increase the stability of the superconductor layers and shunt metal layers.

Figure 1B:
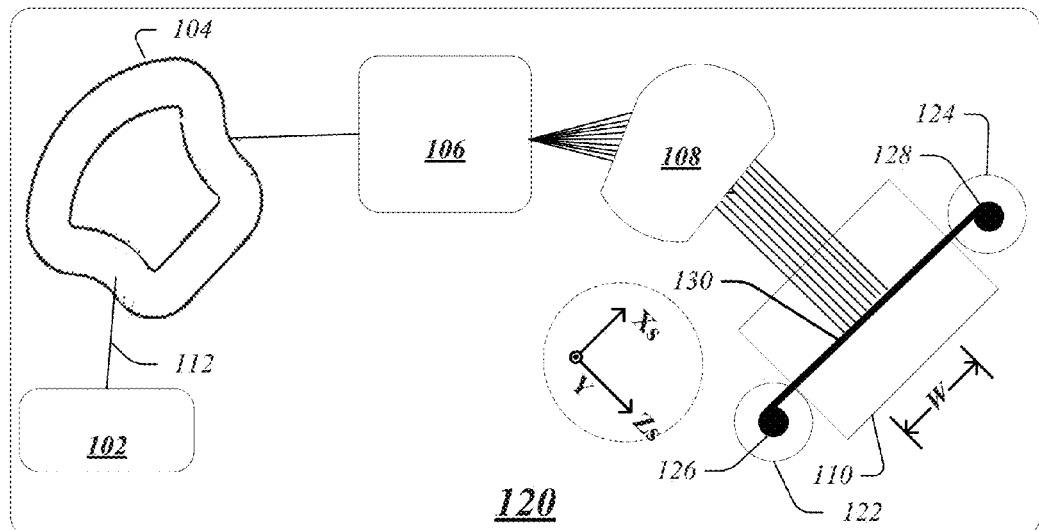

FIG. 1B depicts a variant of the ion implanter 100 of FIG. 1A. In this variant, an ion implanter 120 includes a first vacuum chamber 122 and second vacuum chamber 124 that are disposed on opposite sides of the implantation chamber 110. The first vacuum chamber 122 houses a first reel 126 and the second vacuum chamber houses a second reel 128 that are interoperative to draw a tape 130 through the implantation chamber 110 along a direction or directions parallel to the X-axis. When the ion beam 112 is present in implantation chamber 110 the first reel 126 and second reel 128 are interoperative to draw the tape 130 through the ion beam 112 so that ions intercept a surface of the tape 130 facing upstream. In embodiments in which the tape 130 is a superconductor tape, the ion beam 112 may thus implant into a metal layer that is disposed on the outer surface of the tape 130.

Figure 1C:
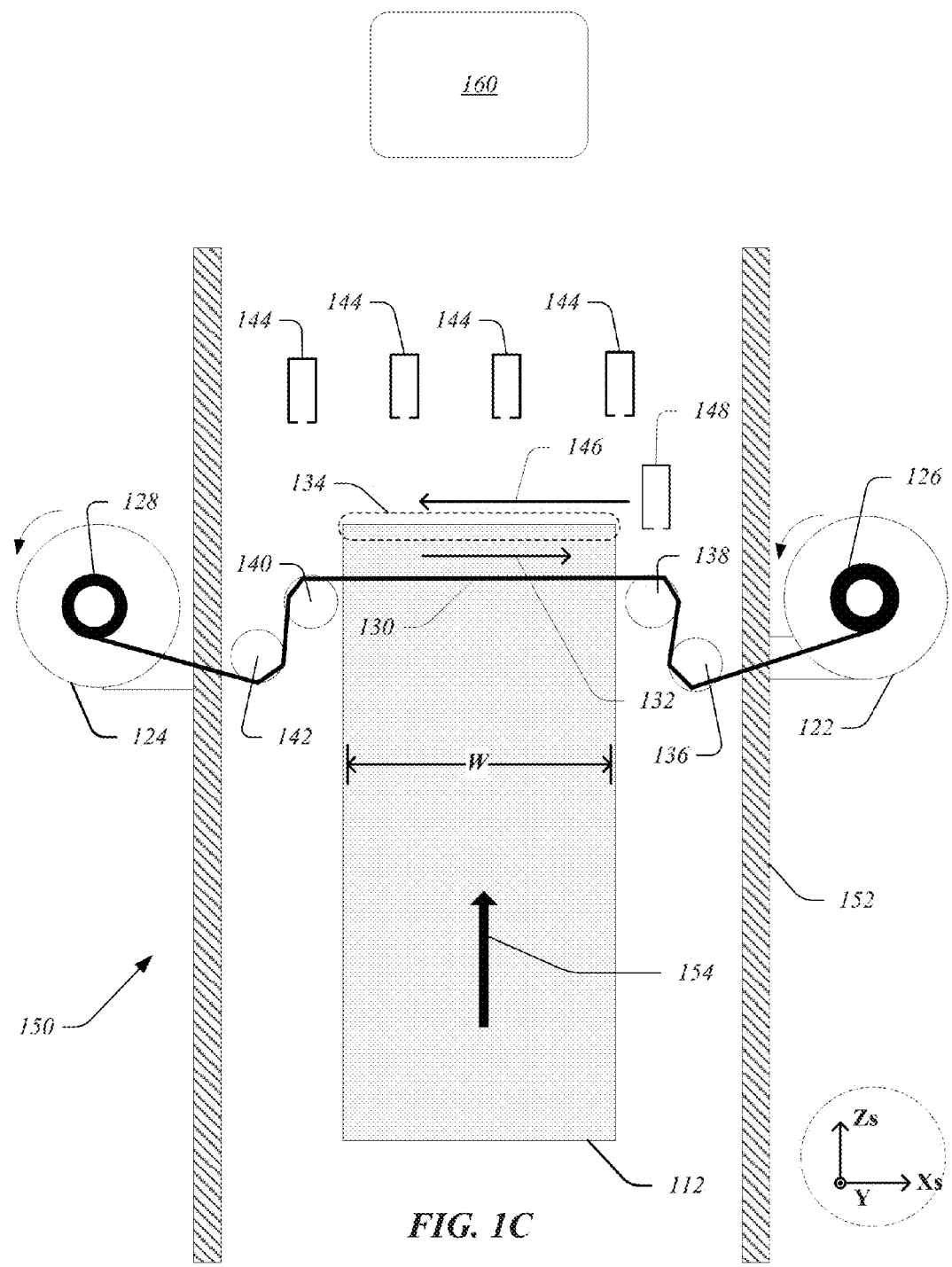
FIGS. 1C and 1D depict a top view and end view, respectively, of an exemplary end station for implanting a tape.
Figure 1D:
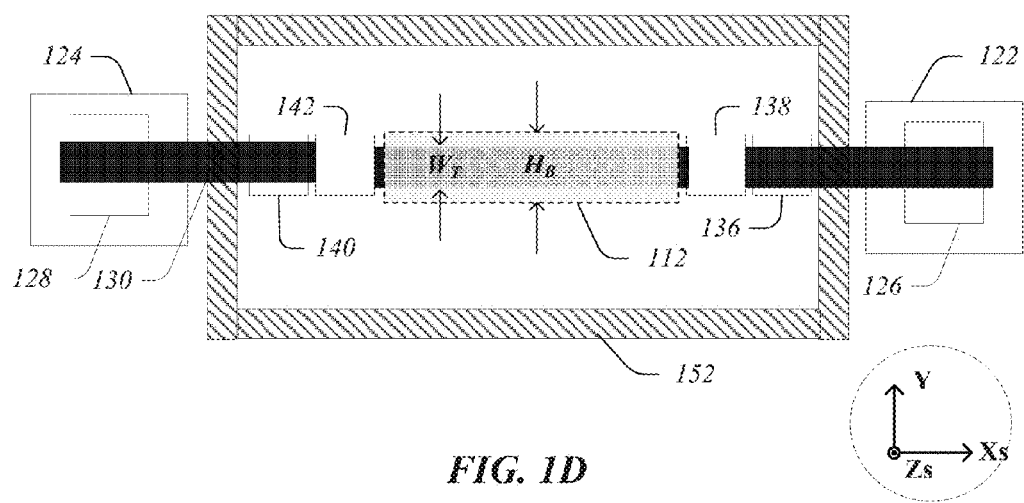

FIG. 1C and FIG. 1D show a respective top view and end view facing downstream of an end station assembly 150 that may be employed for ion implantation of a superconductor tape. In this embodiment, the end station assembly 150 includes the implantation chamber 152 through which an ion beam 112 propagates along the direction of propagation 154 that is parallel to the Zs axis. As shown, the tape 130 may be oriented so that it extends parallel to the Xs axis that is perpendicular to the direction of propagation 154 of the ion beam 112. The tape 130 may also be drawn along the direction 132 which is also parallel to the Xs axis. Implantation of the tape 130 takes place for portions of the tape 130 that are disposed in an implantation zone 134 defined by the width W of the ion beam 112. As illustrated in FIG. 1D, the tape width $W_T$ may be less than beam height $H_B$ along the direction parallel to the Y-axis so that the ion beam 112 intercepts the entire width of the tape 130. As further illustrated in FIG. 1C, the end station assembly 150 includes a series of rollers 136, 138, 140, 142 that guide the tape 130 as it is drawn through the implantation chamber 152.

During ion implantation, in some embodiments, a determined dose of ions may be implanted into the tape 130 by setting the beam current of the ion beam 112 and setting the tape velocity of the tape 130 as it is drawn through the implantation zone 134 so that the determined dose is imparted to any given portion of the tape 130 as it traverses the implantation zone 134. In other embodiments, and as detailed below, in-situ monitoring may be performed to measure the ion beam 112 or the tape 130 or both, in order that adjustments to the implantation process may be performed in real time during implanting of the tape 130. For example, the implantation chamber 152 may include a sensor or sensors including Faraday cup type sensors, shown as Faraday sensors 144. The Faraday sensors 144 may be disposed in various locations within the implantation chamber 152 to monitor beam current. In some embodiments, the Faraday sensors 144 may be movable, such as along the direction 146 parallel to the Xs axis. In further embodiments, the implantation chamber 152 may include other sensors (not shown) such as probes to measure resistivity of the tape 130, thermal sensors to measure temperature of the tape 130, eddy current measuring devices, or other non-contact sensors. The sensors may be coupled to a control system 160, which may include multiple controllers arranged to control operation of implanter components, including the ion beam 112 and reels 126, 128.

In operation the tape 130 may be drawn in a single direction or back and forth between reels 126, 128 through the ion beam 112 multiple times to complete an ion exposure. During ion implantation sensors such as the Faraday sensors 144 may measure ion dose at one or more positions. The ion dose may be calculated as a function of position along the tape 130. In one example, a movable Faraday sensor 148 may move along the direction 146 and may include a beam blocker. The Faraday sensors 144, 148 may be used to determine placement of the tape 130 with respect to the ion beam 112 to ensure that the ion beam intercepts the tape 130 as illustrated in FIG. 1D, for example. The Faraday sensors 144, 148 may be used to calculate the amount of ion dose being applied to the tape 130 by performing measurements with and without the tape 130 being present in the implantation chamber 152. In particular embodiments the Faraday sensor 148 may be used to determine an ion dose map across the tape 130 along the direction 146.

In various additional embodiments the rollers 136, 138, 140, 142 may used to adjust temperature of the tape 130. For example, in one embodiment when the tape 130 is drawn in the direction 132 cooling, such as cryogenic cooling, may be applied to the rollers 140, 142 to cool the tape 130. This may ensure that the tape 130 does not overheat when drawn through the ion beam 112 during implantation. In this embodiment, the rollers 136, 138 may be actively heated or simply not cooled in order to heat the tape 130 back to room temperature as the tape is drawn onto the reel 126. In embodiments, in which the tape 130 is drawn back and forth between reels 126, 128, when the tape 130 is drawn from reel 126 to reel 128, the rollers 140, 142 may be heated while the rollers 136, 138 are cooled.

In various embodiments rotational speed of the reels 126, 128 may be varied to vary the velocity of tape 130 to provide the correct ion dose to the tape 130. In particular embodiments, this variation of tape velocity may be in response to real-time measurements obtained from current sensors such as the Faraday sensors 144, 148.

In various additional embodiments, in which the tape 130 is initially drawn from left to right as shown in FIG. 1D, resistivity of the tape 130 may be performed between the rollers 140 and 142 to determine tape resistivity before ion implantation. For example the rollers 140 and 142, as well as rollers 136, 138 may each include two separate regions that contact the tape 130 and are electrically isolated from one another to facilitate electrical resistance measurements. In further embodiments, assuming the scenario in which the tape 130 is drawn from left to right, resistivity of the tape 130 may be measured between rollers 136 and 138 in real time to determine resistivity of the tape after implant.

In some embodiments, real-time resistivity measurements of tape 130 may be employed for use as a feedback input for closed loop control of an implantation process. For example, in many instances the implanted species that is implanted into a shunt metal layer is effective to increase resistivity of the metal layer. An increase in measured resistivity of the tape 130 may therefore be used to estimate ion dose that has been received by the tape 130. More directly, the measured resistivity of the tape 130 may be compared to a target tape resistivity that is to be achieved after implantation is complete. In one particular example, real-time measurements of change in resistivity or actual resistivity value of the tape 130 may be used to determine when implantation is complete based upon a respective target resistivity change or target resistivity for the tape 130.

In other embodiments, non-contact or contact thermal sensors (not shown) may perform temperature measurements of the tape 130 at multiple points. In particular embodiments, the temperature measurements may be sent to the control system 160 as input for adjusting the cooling and heating provided to the rollers 136, 138, 140, 142. This may be used to ensure that the temperature of the tape 130 is maintained at the proper temperature during implantation and to ensure that the tape temperature is appropriate when gathered on a take-up reel, either reel 126 or reel 128. In further embodiments, a feature (not shown) may be added to or created in the tape 130 that may shadow the ion beam 112 or expose a greater or lesser portion of the ion beam 112 to the Faraday sensors 144, 148 to calibrate the length of the WRT to a control system.

In some embodiments, feedback inputs may be sent to the control system 160 to determine based on ion implantation conditions the composition of a tape such as tape 130 with respect to a known phase diagram. For example, depending upon the amount of implanted species introduced into a metal layer, such as silver, the overall composition of the metal layer being implanted may lie within a single phase region or multiphase region. In one instance, it may be desirable to alter the metal layer being implanted to introduce a second phase that improves the stability of the metal layer. Accordingly, measurement input such as the total ion dose measured that is implanted into the tape 130 may be used by the control system 160 to determine the composition of the tape 130 at a given instance and whether the composition of the tape 130 has been altered in a manner that places it in a desired two-phase region. Alternatively in-situ-measured resistivity, which may be sensitive indication of the composition, may also be used to indicate whether sufficient ions have been implanted into the tape 130 to place it in the two phase region at a given instance. Appropriate process changes may be made in response.

In still further embodiments, a gaseous species (not shown) may be introduced into the implantation chamber 152 in addition to the ion beam 112. The introduction of gaseous species into the implantation chamber 152 may be used to achieve chemical interaction of the implanting species and the tape 130 during the implantation.

In some embodiments the control system 160 may be coupled to other beamline components to adjust the ion beam 112 at the tape 130. For example, an electrostatic lens (not shown) positioned proximate the implantation chamber 152 may be used to increase or decrease the beam width W as it intercepts the tape 130. In still additional embodiments, a positioning system may be used to adjust the tape position to account for glitches in a beamline that may temporarily switch off the beam and create implantation gaps in the tape 130. In other embodiments the reels 126, 128 and rollers 136, 138, 140, 142 may form a rotatable tape drive system that is configured to flip the tape 130 so that both sides of the tape 130 may be exposed to the ion beam 112 without having to remove the tape 130 from the implanter.

Consistent with the present embodiments, a superconductor tape is provided that includes a superconductor layer and metal alloy layer adjacent the superconductor layer, where the metal alloy layer is formed by implantation of ions into a metal layer when the metal layer is disposed on the superconductor layer. As noted the superconductor tape may be integrated into a rigid planar substrate such as a silicon wafer or glass substrate, may be a free standing tape, or may be wound on a barrel.

Figure 2A:
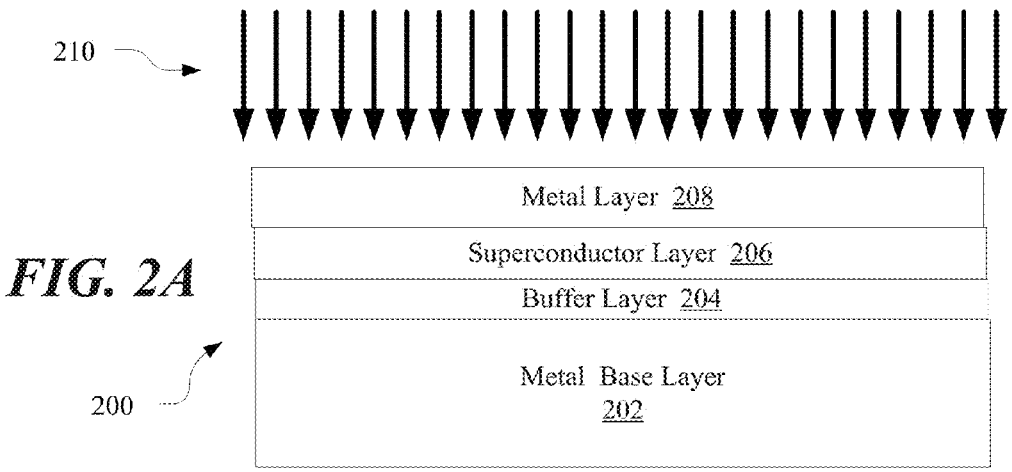
FIGS. 2A to 2B illustrate ion implantation of a superconductor tape according to an embodiment of the disclosure.
Figure 2B:
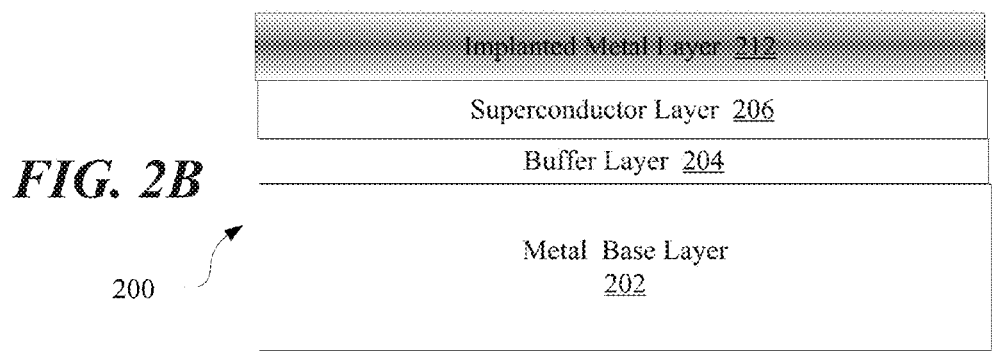

FIGS. 2A and 2B illustrates a side cross-sectional view of implantation of a superconductor tape 200. The superconductor tape 200 includes a base metal layer 202, buffer layer 204, superconductor layer 206 and metal layer 208.

In some embodiments, the base metal layer 202, buffer layer 204, and superconductor layer 206 may constitute a conventional layer stack as known in the art for fabricating superconductor tapes. The base metal layer 202 may be, for example, a steel layer. The buffer layer 204 may be a single layer of multiple layers that are configured to prevent inter-reaction of the superconductor layer and base metal layer as well as to provide a crystalline template for growth of a crystallographically oriented superconductor layer. The superconductor layer 206 may be a superconductor material having the formula ReBa$_2$Cu$_3$O$_{7-x}$ (also referred to herein as "ReBCO") where Re stands for yttrium or any rare earth element; a bismuth strontium calcium copper oxide (BSCCO) of the general formula Bi$_2$Sr$_2$Ca$_{n-1}$Cu$_n$O$_{2n+4+x}$; a thallium strontium calcium copper oxide (TSCCO) of the general formula Tl$_2$Sr$_2$Ca$_{n-1}$Cu$_n$O$_{2n+4+x}$; mercury strontium calcium copper oxide (MSCCO) of the general formula HgSr$_2$Ca$_{n-1}$Cu$_n$O$_{2n+2+x}$.

In some embodiments, and without limitation, the metal layer 208 may be silver, which is a highly electrically conductive metal that is appropriate for use as a shunt metal in a superconductor tape that may be used for current limiting applications. The layer thickness of the metal layer 208 may vary between 0.1 μm and 3 μm in some embodiments in which the metal layer 208 is silver. In particular embodiments the silver layer may include oxygen.

As shown in FIG. 2A ions 210 are directed to toward the metal layer 208. Depending upon the thickness of metal layer 208, the ion energy of ions 210 may be adjusted as needed to place a desired dose of ions 210 within the metal layer 208, resulting in an implanted metal layer 212 after implantation of ions 210 is complete, as illustrated in FIG. 2B. As detailed below the ions 210 may be selected as alloying species that form metal alloys with the material of the metal layer 208 whose properties are determined in part by the nature of the alloy species, concentration, and distribution of alloy species within the implanted metal layer 212. After implantation, the implanted metal layer 212 may exhibit superior performance as compared to the (unimplanted) metal layer 208 in at least property of interest for use in a superconductor tape, including resistance to electromigration, contact resistance between metal layer and superconductor layer 206, resistance to agglomeration, and other properties.

The ion species or combination of ion species that constitute ions 210 as well as ion energy and dose may be tailored according to the desired combination of properties to be achieved. In various embodiments, suitable species for implanting into metal layer 208 include Zn, Sn, Zr, Ta, As, Ge, C, B, N, P. In some embodiments multiple implants may be performed, wherein for a second implant a second set of conditions differs from the first set of conditions of a first implant in at least one of species type, ion energy, or ion dose. Thus, in different embodiments, the above mentioned elements may be implanted singly or in combination with any number of the other elements by performing a series of ion implants. In other embodiments multiple implants of the same element under different implantation conditions where ion energy or ion dose is varied may be performed to tailor the profile of implanted species. As may be appreciated by those of skill in the art, implantation of different species may result in different microstructure of the implanted metal, thereby potentially affecting properties of the implanted metal layer in different fashion. In various embodiments implantation of ions 210 is effective to create a metal alloy in which the original metal material of the metal layer 208 constitutes the major phase. In some embodiments, the overall composition of the implanted metal layer 212 may constitute 0.1 to 30 atomic percent of alloying species derived from the ions 210, with the balance (99.9 to 70 atomic percent) being the original metal material. The embodiments are not limited in this context.

Figure 3A:
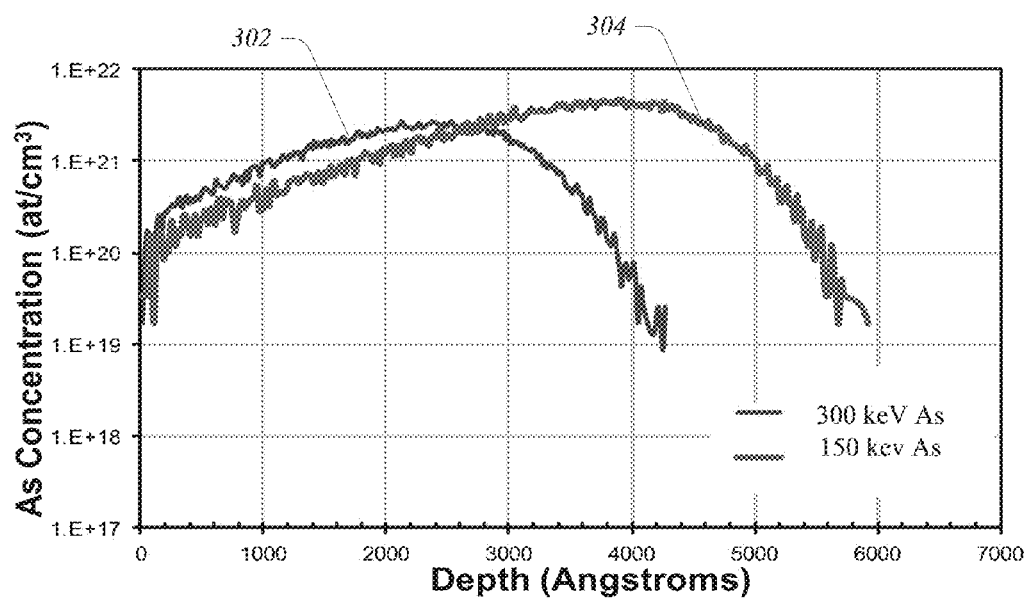
FIGS. 3A, 3B, and 3C depict exemplary implant profiles for different implanting species implanted into a silver layer.
Figure 3B:
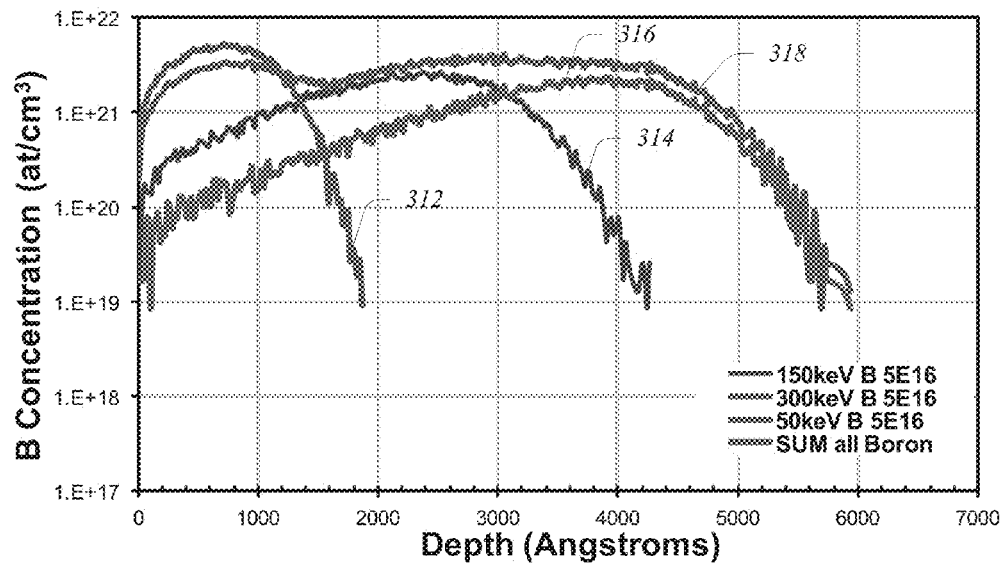
Figure 3C:
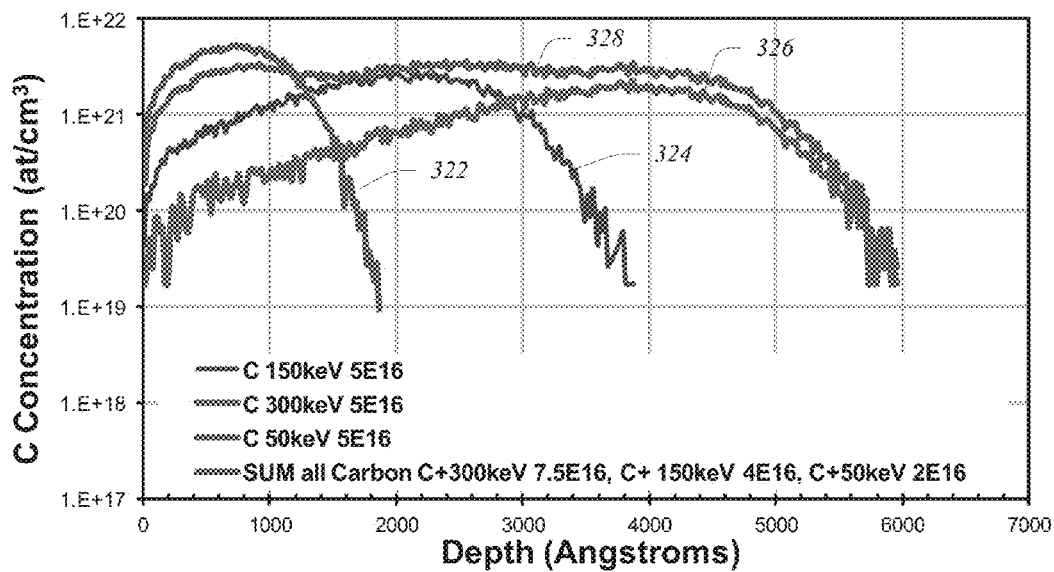

In various embodiments the ion implantation conditions may be tailored according to the ion species and material of the metal layer, as well as metal layer thickness. FIGS. 3A-3C depict results of calculations for ion implantation of various species into a silver layer, showing the concentration of implanted species as a function of depth from surface (implant profile) of the silver layer. In FIG. 3A there are shown the results of simulation of arsenic implantation into silver at energies of 150 keV (curve 302) and 500 keV (curve 304). As illustrated, arsenic reaches a peak concentration at about 250 nm depth for 150 keV and 400 nm at 400 keV. FIG. 3B is a graph that illustrates the results of boron implantation at 50 keV (curve 312), 150 keV (curve 314), 300 keV (curve 316), and a composite of all three implantation energies (curve 318). FIG. 3C shows the results of carbon implantation at 50 keV (curve 322), 150 keV (curve 324), 300 keV (curve 326), and a composite of all three implantation energies (curve 328). As evident from the results of curves 318 and 328, a uniform distribution of boron and carbon may be achieved in a ~450 nm silver layer by performing the respective three implants shown for each ion species. The results are merely exemplary, but illustrate how multiple implants may be employed to achieve a flat as-implanted profile of ion species in a metal layer such as silver.

Considering the Ag system in which silver forms the predominant phase and represents the metal layer 208, the following describe representative microstructures that may result according to different implanted ion species based upon data from equilibrium phase diagrams at room temperature. In the case of implantation of arsenic, a solid solution of a single phase silver material with arsenic ions substituting on silver sites in a silver crystal structure may result when atomic percent arsenic is less than about 3%. In the case of implanting germanium, the implanted silver layer may form a two phase region of germanium and silver because of the negligible solubility of Ge in Ag and the lack of compound formation. The same applies to the implantation of carbon and boron into silver, where no compounds are known to form and solid solubility of carbon or boron in silver is negligible.

In the case of N or P implantation into silver, neither implanting species exhibit solid solubility in Ag but each species is known to form an intermetallic compound with silver. Thus, for example, for overall N or P concentrations of the implanted metal layer 212 of a few tenths of one percent to several percent within a silver layer, a two phase microstructure may be produce that contains silver metal as a matrix material that contains a dispersed second phase of Ag$_3$N or Ag$_2$P compound, respectively. Examples of other suitable ion for implanting into silver to form alloys include Sn and Zn. At atomic concentrations of Sn or Zn below 15%, for example, each of these alloys forms a single phase solid solution with silver. In additional embodiments Zr or Ta may be implanted into a silver layer to form a silver alloy layer. For atomic concentrations of Zr up to 50% Zr, a two phase metallic microstructure may result in which a binary AgZr compound is mixed with a pure (face centered cubic) silver phase.

In various embodiments, a post-implantation annealing process may be performed after the implantation, resulting in redistribution of the as-implanted ions within metal layer. In some embodiments, the annealing temperature may vary between 200° C. to 500° C. and annealing duration may vary between one minute and sixty minutes. The embodiments are not limited in this context. For example, depending upon the temperature of the superconductor tape 200 during implantation, ions may be distributed as isolated atoms or in small clusters within a metal matrix after ion implantation. This distribution may represent a non-equilibrium microstructure. After annealing implanted species may segregate into clusters, or may react with the metal layer 208 to form equilibrium compounds with material of the metal layer 208. Possible resultant phases that may form include phases that are dispersed within a matrix of the initial material that forms the metal layer 208, depending upon the overall concentration of implanted species. The implanted species may also dissolve as substitutional atoms on a lattice site of the material of the metal layer 208 in cases in which a solid solution is possible, or may form phases that segregate in different regions, such as at the top or bottom surfaces of the metal layer 208.

Figure 4A:
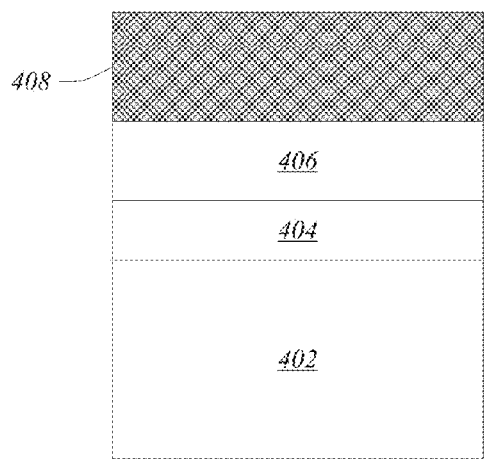
FIGS. 4A, 4B, 4C, and 4D depict microstructures of superconductor tapes after implantation into a metal layer according to respective alternative embodiments.
Figure 4B:
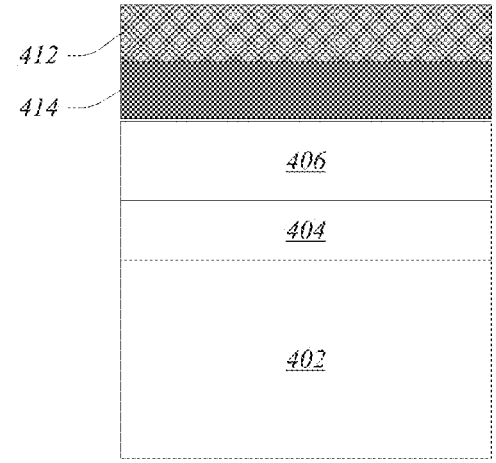
Figure 4C:
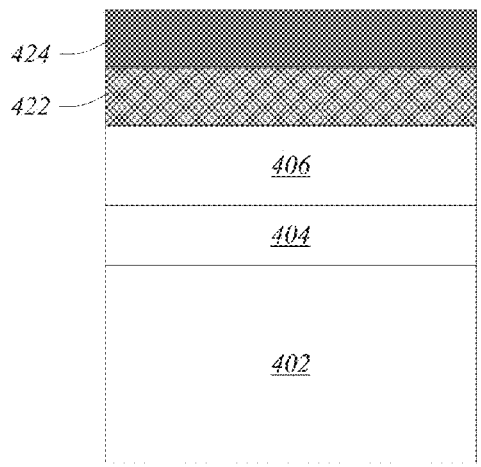
Figure 4D:
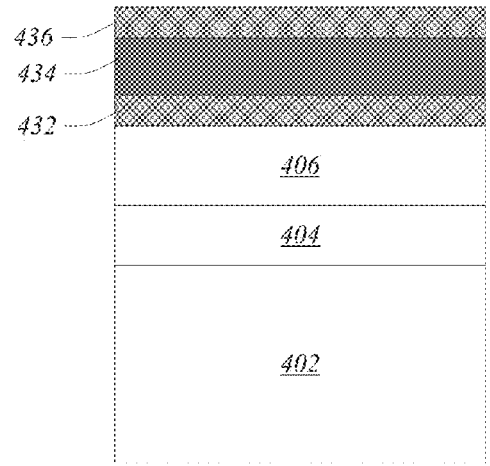

FIGS. 4A-4D depict different microstructures that may result after implantation into a metal tape and annealing consistent with various embodiments. In each case the metal tape structure includes a substrate base 402, buffer layer 404 and superconductor layer 406. It may also be assumed that in each case an unalloyed metal layer such as elemental silver is formed on top of the superconductor layer 406. In FIG. 4A there is shown an example microstructure for a superconductor tape 400 in which the metal layer is transformed into a uniform metal alloy layer 408. In FIG. 4B there is shown an example microstructure for a superconductor tape 410 in which the metal layer is transformed into a surface metal alloy layer 412 and an interface metal layer 414 located adjacent superconductor layer 406. This microstructure may result, for example, if ion implantation energy is such that implanted species are only implanted into a surface portion of the initial metal layer. In FIG. 4C there is shown an example microstructure for a superconductor tape 420 in which the metal layer is transformed into a surface metal layer 424 and an interface metal alloy layer 422. This microstructure may result, for example, if ion implantation energy is such that the peak in implantation is located well below the surface of the metal, or in cases in which free energy considerations favor segregation of pure metal material to surface regions. In FIG. 4C there is shown an example microstructure in which the superconductor tape 430 includes a metal layer 434 sandwiched between an interface metal alloy layer 432 and surface metal alloy layer 436. Again, such a distribution of layers may be promoted based upon initial implant depth of the implanted alloying species as well as free energy considerations.

Returning to FIG. 2B, the type of implanted species, the concentration of implanted species, and the post-implantation annealing to be performed, if any, may be selected according to the desired final properties of the implanted metal layer 212. The final properties, in turn, may directly depend upon the final microstructure of the implanted metal film. In some embodiments, the alloying species, that is, the ions 210, may be selected to impart an increase in resistivity to the implanted metal layer 212, which may induce a resistance in the implanted metal film appropriate for performance in a current limiter device. In other embodiments, the alloying species may be selected based on the tendency to form an intermetallic compound as a second phase within a matrix of the metal material of the metal layer 208. When the intermetallic compound phase segregates as uniformly dispersed crystallites within a host matrix the thermal stability of the resulting film may be increased.

Figure 2C:
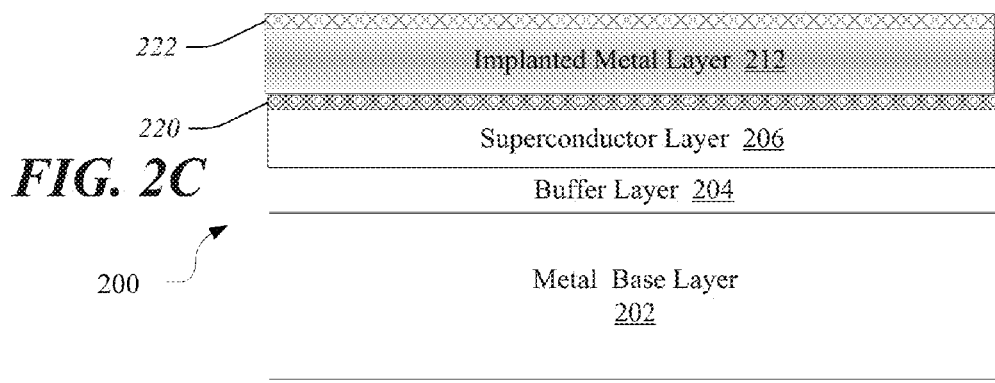
FIG. 2C illustrates exemplary microstructure of a superconductor tape after post-implantation annealing.

In other examples, a compound phase may tend to segregate at surfaces of the implanted layer as noted above. Consistent with embodiments of the disclosure FIG. 2C depicts one example of microstructure of a superconductor tape 200 after implantation into metal layer 208 and post-implantation annealing. In this example, the post-implantation annealing includes annealing in an oxygen-containing ambient. As illustrated, an interface layer 220 has formed between the superconductor layer 206 and metal layer 208.

In one particular example in which the ions 210 are Zn ions, the interface layer 220 may be a zinc-rich silver oxide material that imparts a low contact resistivity between the superconductor layer 206 and implanted metal layer 212. It is to be noted that the implanted metal layer 212 of FIG. 2C may differ from that of FIG. 2B. For example, since a zinc-rich silver oxide has formed at the interface of superconductor layer 206, the implanted metal layer 212 of FIG. 2C may have a lower concentration of Zn than in FIG. 2B. In addition, as further shown in FIG. 2C, a surface layer 222 has formed on an outside surface of the superconductor tape 200. The surface layer 222 may be a zinc-rich metal layer in one example.

In further embodiments of a superconductor tape ions 210 may be species that improve the properties of the underlying layer, superconductor layer 206, including Zr or Ta. In some embodiments, Zr or Ta are implanted into a silver layer to generate molar concentrations of about 0.5% to 10% to form a metal alloy layer. The embodiments are not limited in this context. After annealing, for example, at 300° C. or higher using an oxygen-containing ambient, Zr or Ta species that are initially implanted in the implanted metal layer 212 may react with at least a portion of the superconductor layer 206. The reaction with Zr or Ta may form a precipitate phase such as $ZrBaO_x$ or $TaBaO_x$ that is effective in creating flux pinning centers within the superconductor layer, which are desirable to prevent flux creep that is observed in type II superconductors.

Figure 2D:
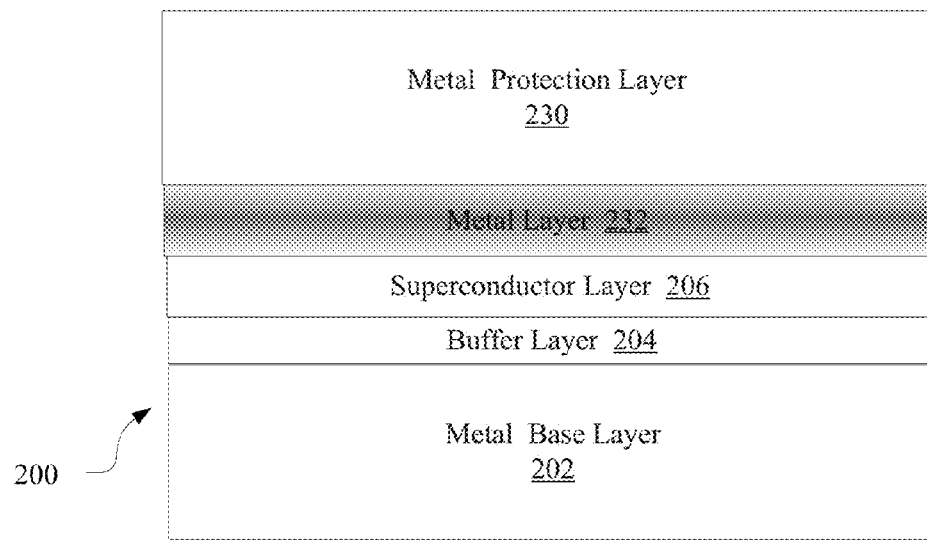
FIG. 2D illustrates exemplary structure after implantation of another superconductor tape according to an embodiment of the disclosure.

Consistent with additional embodiments, a second metal layer may be deposited upon the metal layer used as a shunt metal. FIG. 2D depicts an embodiment in which a metal protection layer 230 is formed on the outer surface of the metal layer 232. In some embodiments, the metal protection layer 230 may have a thickness that ranges from 2 μm to 30 μm. The metal protection layer 230 may be copper or a copper alloy in various embodiments and may serve to protect the underlying layers of the superconductor tape 200. In particular embodiments, the metal protection layer 230 may be formed after the metal layer 208 is implanted and annealed. In the example of FIG. 2D the metal layer 232 represents a metal layer 208 after implantation and annealing. In this case, the metal layer 232 may include a solid solution of implanted species in a host metal (metal material of unimplanted metal layer 208), or may constitute a dispersion within the host metal of an intermetallic compound formed from the host metal and implanting species, to list two examples.

In other embodiments, the metal layer 208 may be implanted prior to formation of the metal protection layer 230, but annealing of the implanted metal layer 208 may be postponed until after formation of the metal protection layer 230. In still further embodiments ion implantation of the metal layer 208 may be postponed until after formation of the metal protection layer 230.

In further embodiments of a superconductor tape in which a bilayer metal stack containing a shunt metal layer and metal protection layer are deposited on a superconductor layer, each metal layer may be implanted separately to control layer properties. For example, in an embodiment of an Ag/Cu stack, a silver shunt layer may be implanted according to one of the procedures generally outlined above. A copper layer may be subsequently deposited upon the silver layer, either before or after post-implantation annealing is performed on the silver layer. The copper layer may subsequently be implanted to alter its properties. In some embodiments, the implanted species introduced into the copper layer may be an alloying element or elements effective for reducing copper layer grain growth, roughening, and/or agglomeration. Examples of effective alloying elements include Sn, Zn and other elements that form solid solutions with copper; and Zr, Ta, and other elements that may form precipitate phases. The choice of alloying element may be based in part on the desired resistivity of the copper layer to be achieved by the alloying element. For example, additions of elements that form a solid solution with copper may result in relatively smaller increases in resistance in comparison to pure copper layers, whereas addition of elements that form precipitates may produce a relatively greater increase in resistance.

In various embodiments the implantation of alloying element is effective in engineering an increase in sheet resistance in the metal layer(s) disposed on the superconductor layer of the superconductor tape. This is useful to increase the voltage drop per unit length of superconductor tape and thereby reduce the length of superconductor tape required in a given SCFCL. The incorporation of an alloying element in a copper layer of a copper/silver bilayer system may be effective to increase sheet resistance in two ways. As a first matter it is to be noted that the copper overlayer may be many times thicker than the silver underlayer that contacts the superconductor layer. In some tape structures, for example, the copper layer may have a thickness of about 20 μm and the silver layer 1 μm. Accordingly, because pure copper and pure silver have similar resistivity, the sheet resistance of the Cu/Ag stack is dominated by the sheet resistance of the copper overlayer. With this in mind, in various embodiments an alloying element such as Zr may be added to increase the resistivity of the copper overlayer.

Secondly, by virtue of the increased resistance to agglomeration or other unwanted layer changes that is imparted to a copper overlayer when alloyed with certain elements such as Zr, in further embodiments the total layer thickness of copper in a superconductor tape may be reduced. For example in some embodiments a copper alloy having 10 micrometer thickness may be used as an overlayer to conduct fault current in a superconductor tape. With the addition of an appropriate amount of Zr, such as several percent up to about twenty percent, the 10 micrometer thick copper alloy layer may resist roughening or agglomeration under high temperature conditions that are effective to roughen a thicker layer such as a twenty micrometer thick pure copper film.

In various embodiments, ion implantation may be performed into a metal layer of a superconductor tape structure that is integrated into a planar substrate such as a silicon wafer or glass plate. In such structures the ion implantation and post-implantation annealing may proceed as disclosed above. However, during ion implantation, ions may also implant into regions of the substrate that do not contain metal. In particular, the superconductor tape structure may include a metal layer and superconductor layer formed on a substrate as a patterned stack that defines a pattern such as a serpentine line on the substrate.

Figure 5A:
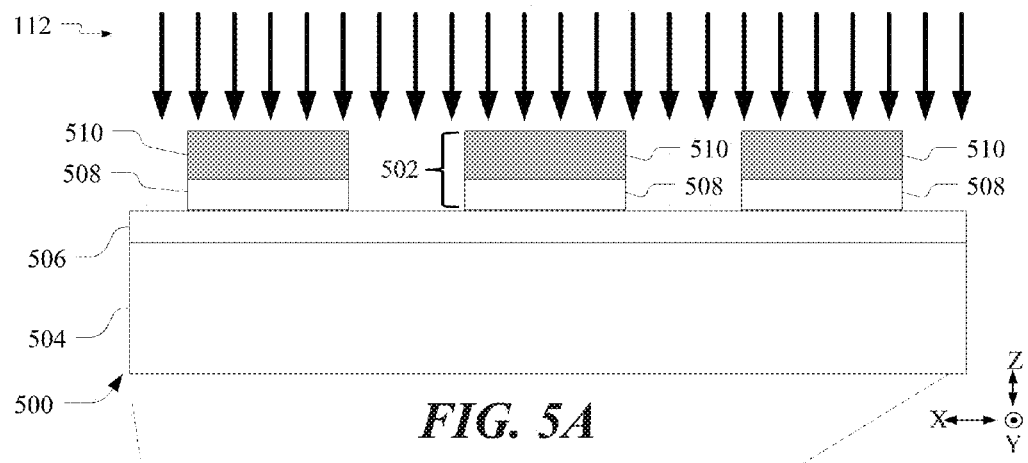
FIGS. 5A and 5B depict a side cross-sectional view and end view, respectively, of an exemplary integrated superconductor tape according to further embodiments.
Figure 5B:
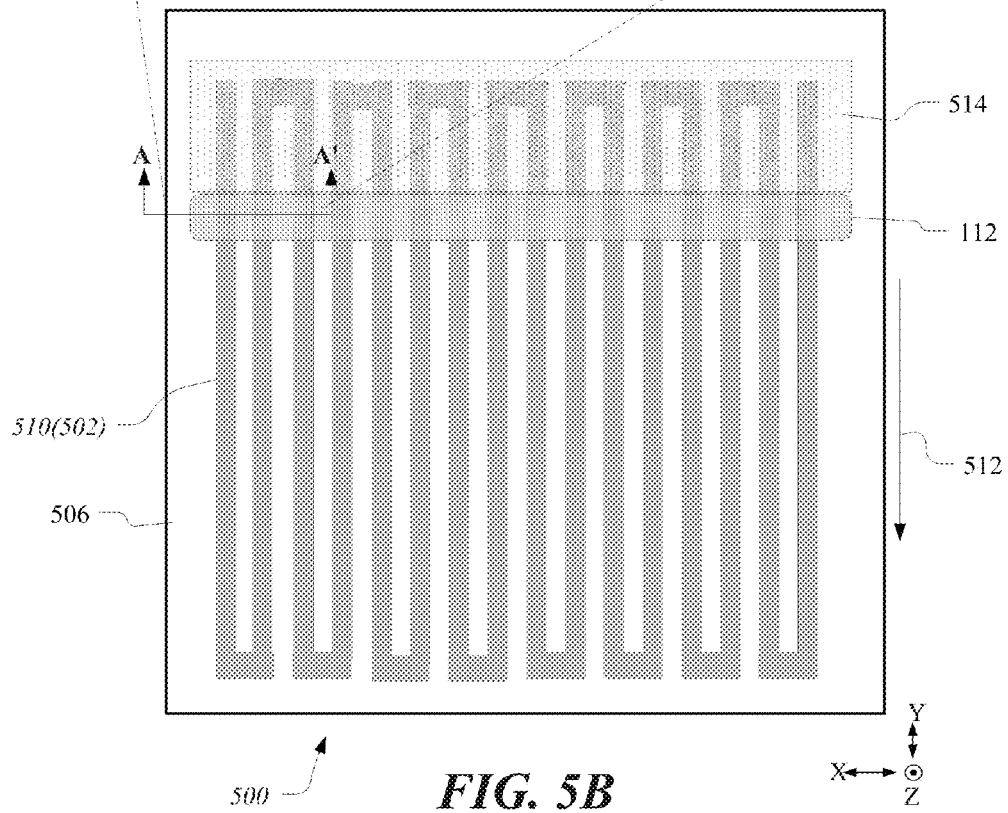

FIG. 5A and FIG. 5B depict a respective side cross-sectional view and plan view of implantation into an integrated superconductor device 500 that contains a superconductor tape 502 integrally formed within the integrated superconductor device 500. In particular, FIG. 5A presents a cross-section along the segment A-A' shown in FIG. 5B. The superconductor tape 502 is formed by forming a buffer layer 506 on a substrate base 504 and subsequently forming a superconductor layer 508 and shunt metal layer 510 as illustrated. In some embodiments the superconductor layer 508 and shunt metal layer 510 may be formed as blanket layers followed by lithographically patterning the blanket layers and etching to form the serpentine pattern shown in FIG. 5B. Once the superconductor tape 502 is formed, the integrated superconductor device 500 may be placed in a beamline implanter for exposure to an ion beam 112 as shown in particular in FIG. 5B. The ion beam 112, which is depicted as a ribbon beam, may be scanned along the direction 512 so that the entire surface of the integrated superconductor device 500 is exposed to ions. As illustrated, the exposed portions of the buffer layer 506 and shunt metal layer 510 are implanted with ions, forming the implanted region 514 as the ion beam 112 is scanned along the direction 512. Notably, the buffer layer 506 may be altered during implantation of ions into the desired shunt metal layer 510. However, the alteration of buffer layer 506 may not affect performance of the superconductor tape 502 since during operation current is conducted along the path defined by the serpentine structure of the superconductor tape 502. Accordingly, changes in the properties of exposed portion of buffer layer 506 incurred during ion implantation may have no effect on performance of the superconductor tape 502.

In additional embodiments, ion implantation into a shunt metal layer may take place before formation of a tape structure in a substrate. For example, a buffer layer, superconductor layer, and shunt metal layer may be formed in that order as a layer stack of blanket coatings on a substrate base, such as silicon. Subsequently the shunt metal layer of the layer stack may be implanted as generally depicted in FIGS. 5A-5B except that the layer stack is not patterned before the implantation. The blanket layer stack may also be annealed after implantation. Subsequently, lithography and etching may be performed to define a tape pattern such as that shown in FIG. 5B.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A method of forming a superconductor tape, comprising:
   depositing a superconductor layer on a substrate;
   forming a metal layer comprising a first metal on a surface of the superconductor layer; and
   implanting an alloy species as ions into the metal layer, wherein the first metal forms a metal alloy after the implanting of the alloy species, wherein the ions are not implanted into the superconductor layer.

2. The method of claim 1, further comprising providing the metal layer and superconductor layer as a patterned stack that defines a first pattern on the substrate.

3. The method of claim 1, wherein the substrate comprises a metal tape, the method further comprising continuously drawing the metal tape through an implant zone containing ions of the alloy species during the implanting.

4. The method of claim 1, wherein the substrate comprises a substrate base and an intermediate layer that comprises a material having a preferred crystallographic orientation.

5. The method of claim 1, further comprising annealing the metal layer after the implanting.

6. The method of claim 1, wherein the metal layer is silver.

7. The method of claim 1 wherein the metal layer is a shunt metal layer, the method further comprising depositing a protection metal layer on the shunt metal layer after the implanting.

8. The method of claim 1, wherein the alloy species forms a mole fraction of 0.1% to 30% with respect to the metal.

9. The method of claim 6, wherein the alloy species comprises at least one of Zn, Sn, Zr, Ta, As, Ge, C, B, N, or P.

10. The method of claim 1, wherein the implanting the alloy species comprises:
    performing a first implant under a first set of conditions;
    and performing a second implant under a second set of conditions, wherein the second set of conditions differs from the first set of conditions in at least one of species type, ion energy, or ion dose.

* * * * *